United States Patent
Wu et al.

(10) Patent No.: US 11,823,751 B2
(45) Date of Patent: Nov. 21, 2023

(54) MEMORY DEVICE AND OPERATION METHOD THEREOF

(71) Applicant: MACRONIX INTERNATIONAL CO., LTD., Hsinchu (TW)

(72) Inventors: Guan-Wei Wu, Zhubei (TW); Yao-Wen Chang, Zhubei (TW); I-Chen Yang, Miaoli County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 157 days.

(21) Appl. No.: 17/679,170

(22) Filed: Feb. 24, 2022

(65) Prior Publication Data

US 2023/0268016 A1 Aug. 24, 2023

(51) Int. Cl.

| G11C 16/34 | (2006.01) |
| G11C 16/04 | (2006.01) |
| G11C 16/10 | (2006.01) |
| G11C 16/24 | (2006.01) |
| G11C 16/28 | (2006.01) |
| G11C 16/30 | (2006.01) |
| G11C 16/08 | (2006.01) |

(52) U.S. Cl.
CPC ...... *G11C 16/3459* (2013.01); *G11C 16/0433* (2013.01); *G11C 16/08* (2013.01); *G11C 16/102* (2013.01); *G11C 16/24* (2013.01); *G11C 16/28* (2013.01); *G11C 16/30* (2013.01)

(58) Field of Classification Search
None
See application file for complete search history.

(56) References Cited

U.S. PATENT DOCUMENTS

| 9,036,422 B2 | 5/2015 | Son |
| 10,854,296 B2 | 12/2020 | Seo et al. |
| 2022/0020432 A1* | 1/2022 | Li ..................... G11C 16/32 |

FOREIGN PATENT DOCUMENTS

| TW | I713204 B | 12/2020 |
| WO | 2012/162316 A1 | 11/2012 |

* cited by examiner

*Primary Examiner* — Kretelia Graham
(74) *Attorney, Agent, or Firm* — McClure, Qualey & Rodack, LLP (57) ABSTRACT

A memory device and an operation method thereof are provided. The operation method includes: when a read operation or a write-verify operation is completed, during a word line voltage lowering phase, synchronously applying a plurality of different gradually lowering signal line reference voltages to a plurality of ground select lines and a plurality of string select lines, wherein values of the different gradually lowering signal line reference voltages are corresponding to a plurality of signal line positions of the ground select lines and the string select lines.

16 Claims, 5 Drawing Sheets

MEMORY DEVICE AND OPERATION METHOD THEREOF

TECHNICAL FIELD

The disclosure relates in general to a memory device and an operation method thereof.

BACKGROUND

In two-dimension memory device, there is electrical contact between the channels and the P well. When a negative word line voltage is applied and the P well is at 0V, the channel potential is not lowered to a negative voltage. This is because the P well continuously supplies holes to keep the channel potential.

However, in three-dimension memory device, there is no electrical contact between the channels and the P well. In programming operations or read operations, as the word line voltage is lowered, the channel is at the floating state (no conductive path to the sources and the bit lines). The channel potentials may be capacitively coupled and down-boosted to negative voltages. This leads to situations where there is a large electric field between the programmed word lines and the adjacent word lines (in the erased state), potentially resulting in hot electron mode disturbance.

For example, the word lines WL1 and WL(N-1) (N being a positive integer and N>2) are programmed to high threshold voltage (Vt) state while other word lines are in the erase state. As the word line voltages at the word lines WL1 and WL(N-1) having the high Vt state is lowered, the word lines WL2-WL(N-2) between the word lines WL1 and WL(N-1) are floated. Further, there is a large electric field between the word lines WL0 and WL1, and between the word lines WLN and WL(N-1). Thus, the word lines WL0 and WLN are subjected to hot-electron mode disturbance. As the read cycles are more, the Vt of the word lines subjected to hot-electron mode disturbance is higher, which negatively affects the operations and performance of the 3D memory device.

Thus, how to prevent the hot-electron mode disturbance is one of major efforts.

SUMMARY

According to one embodiment, provided is an operation method for a memory device including a plurality of ground select lines, a plurality of string select lines, a plurality of dummy ground select lines and a plurality of dummy string select lines, the operation method including: when a read operation or a write-verify operation is completed, during a word line voltage lowering phase, synchronously applying a plurality of different gradually lowering signal line reference voltages to the ground select lines and the string select lines, wherein values of the different gradually lowering signal line reference voltages are corresponding to a plurality of signal line positions of the ground select lines and the string select lines.

According to another embodiment, provided is a memory device including: a plurality of memory cells, a plurality of ground select lines, a plurality of dummy ground select lines, a plurality of bit lines, a plurality of string select lines, a plurality of dummy string select lines, a plurality of word lines, coupled to the memory cells, the memory cells further coupled to the bit lines; and a plurality of switch, coupled to the ground select lines, the dummy ground select lines, the bit lines, the string select lines and the dummy string select lines. When a read operation or a write-verify operation is completed, during a word line voltage lowering phase, a plurality of different gradually lowering signal line reference voltages are synchronously applied to the ground select lines and the string select lines. Values of the different gradually lowering signal line reference voltages are corresponding to a plurality of signal line positions of the ground select lines and the string select lines.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

Figure 1:
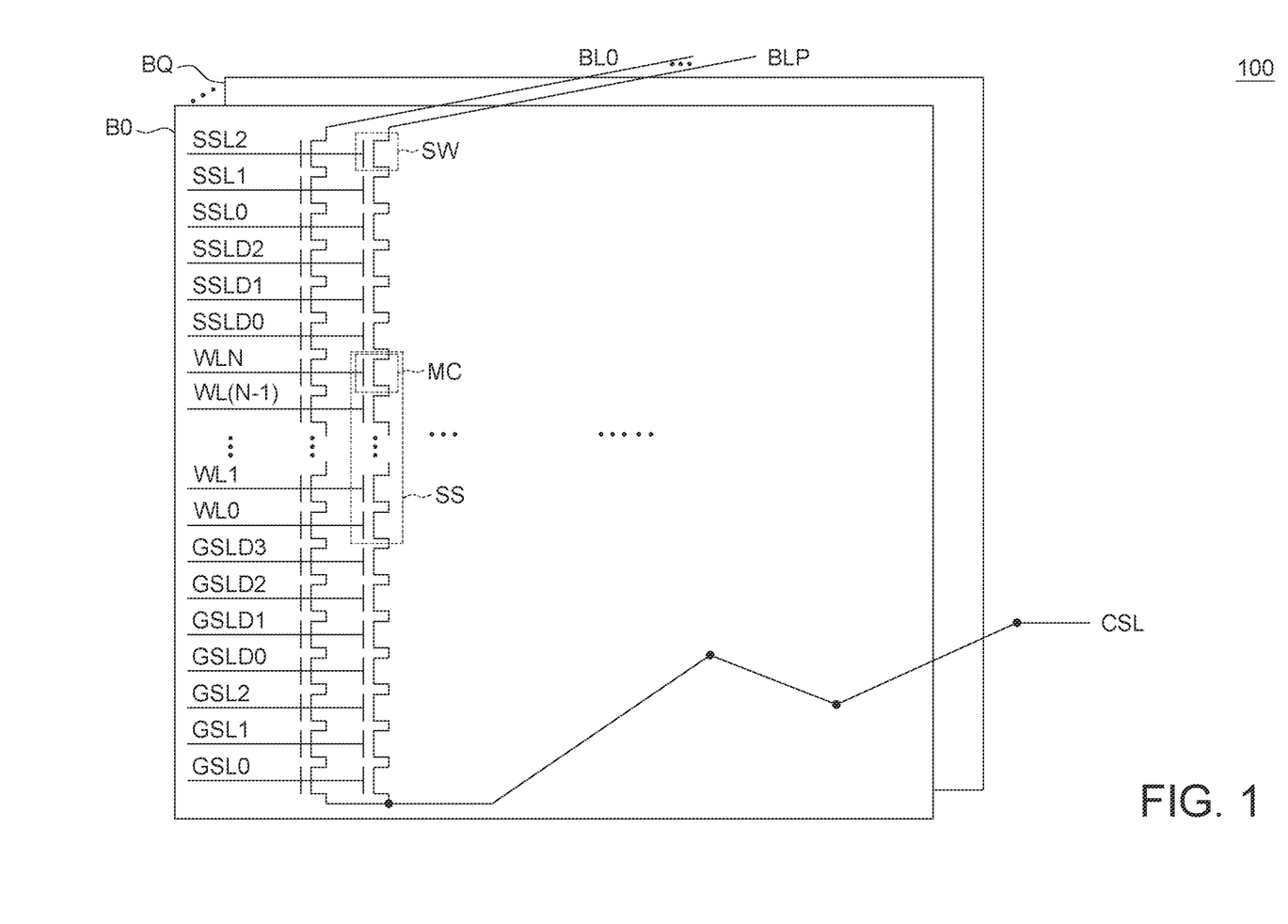
FIG. 1 shows an equivalent circuit diagram of a memory device according to one embodiment of the application.

FIG. 1 shows an equivalent circuit diagram of a memory device 100 according to one embodiment of the application. The memory device 100 is for example but not limited by a three-dimension (3D) memory device. As shown in FIG. 1, the memory device 100 includes a plurality of memory blocks B0-SQ (Q being a positive integer), a common source line CSL, a plurality of word lines WL0-WLN (N being a positive integer), a plurality of bit lines BL0-BLP (P being a positive integer), a plurality of string select lines, a plurality of dummy string select lines, a plurality of ground select lines and a plurality of dummy ground select lines. FIG. 1 shows three string select lines SSL0-SSL2, three dummy string select lines SSLD0-SSLD2, three ground select lines GSL0-GSL2 and four dummy ground select lines GSLD0-GSLD3, but the application is not limited by this. Respective number of the string select lines, the dummy string select lines, the ground select lines and the dummy ground select lines may be different from FIG. 1, which is still within the scope and the spirit of the application.

As shown in FIG. 1, in the memory device 100, the signal lines are positioned in sequence, from bottom to top: the ground select lines GSL0-GSL2 and the dummy ground select lines GSLD0-GSLD3, the word lines WL0-WLN, the dummy string select lines SSLD0-SSLD2 and the string select lines SSL0-SSL2. That is, the ground select line GSL0 is at bottom while the string select line SSL2 is at top. In one embodiment of the application, "outer" defines away from the word lines WL0-WLN, and "inner" defines close to the word lines WL0-WLN. For example, the ground select line GSL0 and the string select line SSL2 are referred as the outermost signal lines because the around select line GSL0 and the string select line SSL2 are farthest away from the word lines WL0-WLN: and the dummy ground select line GSLD3 and the dummy string select line SSLD0 are referred as the innermost signal lines because the dummy ground select line GSLD3 and the dummy string select line SSLD0 are nearest to the word lines WL0-WLN.

Each of the memory blocks B0-BQ includes a plurality of switches SW and a plurality of memory strings SS. Each of the memory strings SS includes a plurality of memory cells MC. The memory cells MC are at intersections of the word lines WL0-WLN and the bit lines BL0-BLP. In the same memory block, the memory cells coupled to the same bit line form a memory string SS.

The switches SW are at intersections of the string select lines SSL0-SSLN and the bit lines BL0-BLP, or at intersections of the dummy string select lines SSLD0-SSLD2 and the bit lines BL0-BLP, or at intersections of the ground select lines GSL0-GSL2 and the bit lines BL0-BLP, or at intersections of the dummy ground select lines GSLD0-GSLD3 and the bit lines BL0-BLP, respectively. When a corresponding memory string SS is selected, a corresponding switch SW is turned on.

A plurality of cell currents flowing through the memory strings SS are input into a backend corresponding circuit via the common source line CSL, to perform corresponding operations.

Figure 2:
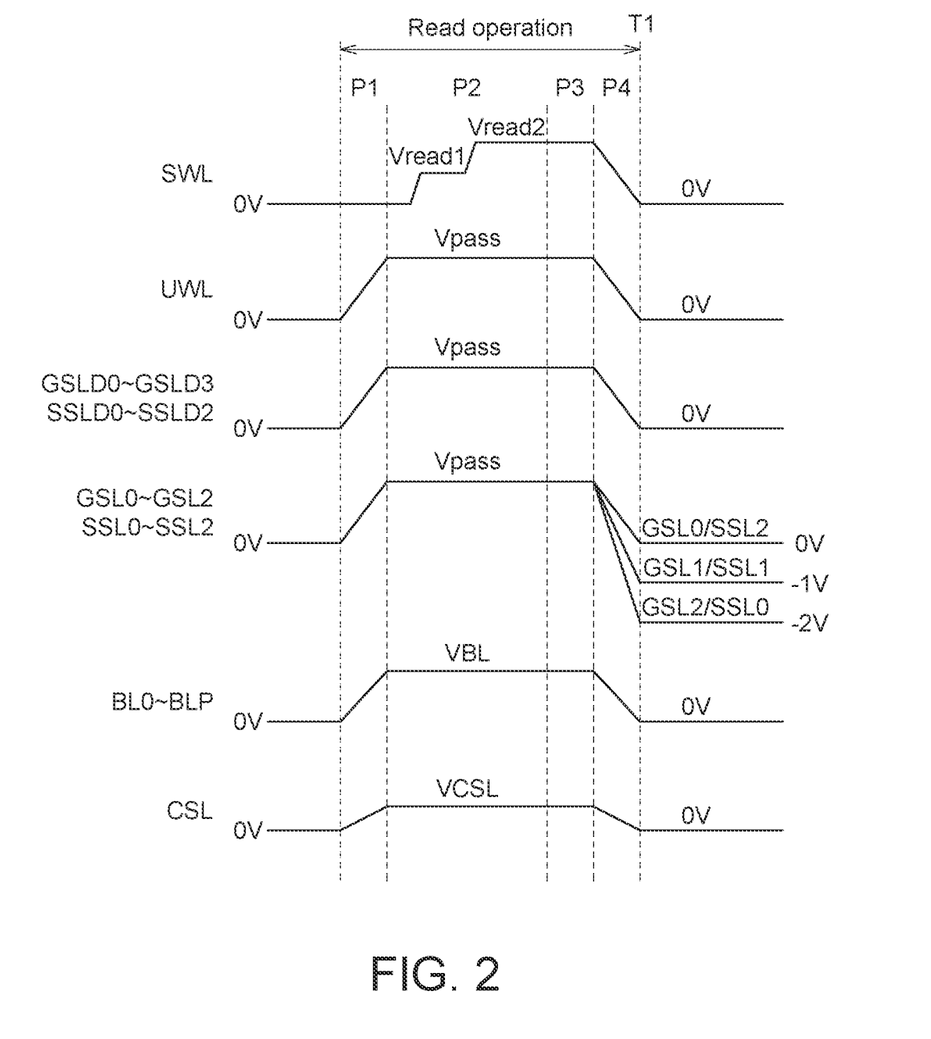
FIG. 2 shows a signal waveform of the memory device according to one embodiment of the application.

FIG. 2 shows a signal waveform of the memory device according to one embodiment of the application. FIG. 2 shows the read operation, but the application is not limited by this. Other embodiments of the application are applied in a write verify operation which includes a program verify operation and an erase verify operation.

As shown in FIG. 2, before the read operation, a selected word line SWL, a plurality of unselected word lines UWL, the dummy ground select lines GSLD0-GSLD3, the dummy string select lines SSLD0-SSLD2, the ground select lines GSL0-GSL2, the string select lines SSL0-SSL2, the bit lines BL0-BLP and the common source line CSL are biased at a first reference voltage, for example but not limited by 0V. The selected word line SWL is one among the word lines WL0-WLN while the unselected word lines UWL are other unselected word lines.

The read operation includes four phases P1-P4 which are described later.

During the first phase P1, the selected word line SWL is maintained at the first reference voltage; the unselected word lines UWL are biased to pull up from the first reference voltage to a second reference voltage Vpass (for example but not limited by 8V-9V); the dummy ground select lines GSLD0-GSLD3 and the dummy string select lines SSLD0-SSLD2 are biased to pull up from the first reference voltage to the second reference voltage Vpass; the ground select lines GSL0-GSL2 and the string select lines SSL0-SSL2 are biased to pull up from the first reference voltage to the second reference voltage Vpass; the bit lines BL0-BLP are biased to pull up from the first reference voltage to a third reference voltage VBL (for example but not limited by 1.3V); and the common source line CSL is biased to pull up from the first reference voltage to a fourth reference voltage VCSL (for example but not limited by 0.6V).

During the second phase P2, the selected word line SWL is biased to pull up from the first reference voltage to a fifth reference voltage Vread1 (for example but not limited by 2V), and from the fifth reference voltage Vread1 to a sixth reference voltage Vread2 (for example but not limited by 6V); the unselected word lines UWL are maintained at the second reference voltage Vpass; the dummy ground select lines GSLD0-GSLD3 and the dummy string select lines SSLD0-SSLD2 are maintained at the second reference voltage Vpass; the ground select lines GSL0-GSL2 and the string select lines SSL0-SSL2 are maintained at the second reference voltage Vpass; the bit lines BL0-BLP are maintained at the third reference voltage VBL; and the common source line CSL is maintained at the fourth reference voltage VCSL.

During the third phase P3, the selected word line SWL is maintained at the sixth reference voltage Vread2; the unselected word lines UWL are maintained at the second reference voltage Vpass; the dummy ground select lines GSLD0-GSLD3 and the dummy string select lines SSLD0-SSLD2 are maintained at the second reference voltage Vpass; the ground select lines GSL0-GSL2 and the string select lines SSL0-SSL2 are maintained at the second reference voltage Vpass; the bit lines BL0-BLP are maintained at the third reference voltage VBL; and the common source line CSL is maintained at the fourth reference voltage VCSL During the fourth phase P4, the selected word line SWL is biased to pull down from the sixth reference voltage Vread2 to the first reference voltage; the unselected word lines UWL are biased to pull down from the second reference voltage Vpass to the first reference voltage; the dummy ground select lines GSLD0-GSLD3 and the dummy string select lines SSLD0-SSLD2 are biased to pull down from the second reference voltage Vpass to the first reference voltage; the ground select line GSL0 and the string select line SSL2 are biased to pull down from the second reference voltage Vpass to a seventh reference voltage (for example but not limited by 0V); the ground select line GSL1 and the string select line SSL1 are biased to pull down from the second reference voltage Vpass to an eighth reference voltage (for example but not limited by −1V); the ground select line GSL2 and the string select line SSL0 are biased to pull down from the second reference voltage Vpass to a ninth reference voltage (for example but not limited by −2V); the bit lines BL0-BLP are biased to pull down from the third reference voltage VBL to the first reference voltage; and the common source line CSL is biased to pull down from the fourth reference voltage VCSL to the first reference voltage.

As shown in FIG. 2, during the fourth phase P4 (i.e. during a word line voltage falling phase), the gradually falling reference voltages are applied to the ground select lines GSL0-GSL2 and the string select lines SSL0-SSL2 to prevent the hot electron mode disturbance. The reasons are described as follows.

After the four phases P1-P4 of the read operations are completed, at the timing T1, the selected word line SWL is maintained at the first reference voltage; the unselected word lines UWL are maintained at the first reference voltage; the dummy ground select lines GSLD0-GSLD3 and the dummy string select lines SSLD0-SSLD2 are maintained at the first reference voltage; the ground select line GSL0 and the string select line SSL2 are maintained at the seventh reference voltage; the ground select line GSL1 and the string select line SSL1 are maintained at the eighth reference voltage; the ground select line GSL2 and the string select line SSL0 are maintained at the ninth reference voltage; the bit lines BL0-BLP are maintained at the first reference voltage; and the common source line CSL is maintained at the first reference voltage.

In FIG. 2, the voltage difference between the seventh reference voltage, the eighth reference voltage and the ninth reference voltage is 1V, but the application is not limited by this. In other possible embodiment of the application, the voltage difference between the seventh reference voltage, the eighth reference voltage and the ninth reference voltage may have other values, which is still within the spirit and the scope of the application.

In FIG. 2, the voltages applied to the ground select lines GSL0-GSL2 and the string select lines SSL0-SSL2 have linear falling waveforms, but the application is not limited by this. In other possible embodiment of the application, the voltages applied to the ground select lines GSL0-GSL2 and the string select lines SSL0-SSL2 may have other falling waveforms, which is still within the spirit and the scope of the application.

As shown in FIG. 2, in one embodiment of the application, when a read operation or a write-verify operation is completed, during a word line voltage lowering phase, a plurality of different gradually lowering signal line reference voltages are synchronously applied to the ground select lines and the string select lines. Values of the different gradually lowering signal line reference voltages are corresponding to a plurality of signal line positions of the ground select lines and the string select lines.

As shown in FIG. 2, in one embodiment of the application, a first signal reference voltage applied to an outer ground select line (for example, GSL0) and an outer string select line (for example, SSL2) among the ground select lines and the string select lines is higher than a second signal reference voltage applied to an inner ground select line (for example, GSL1) and an inner string select line (for example, SSL1) among the ground select lines and the string select lines.

Figure 3:
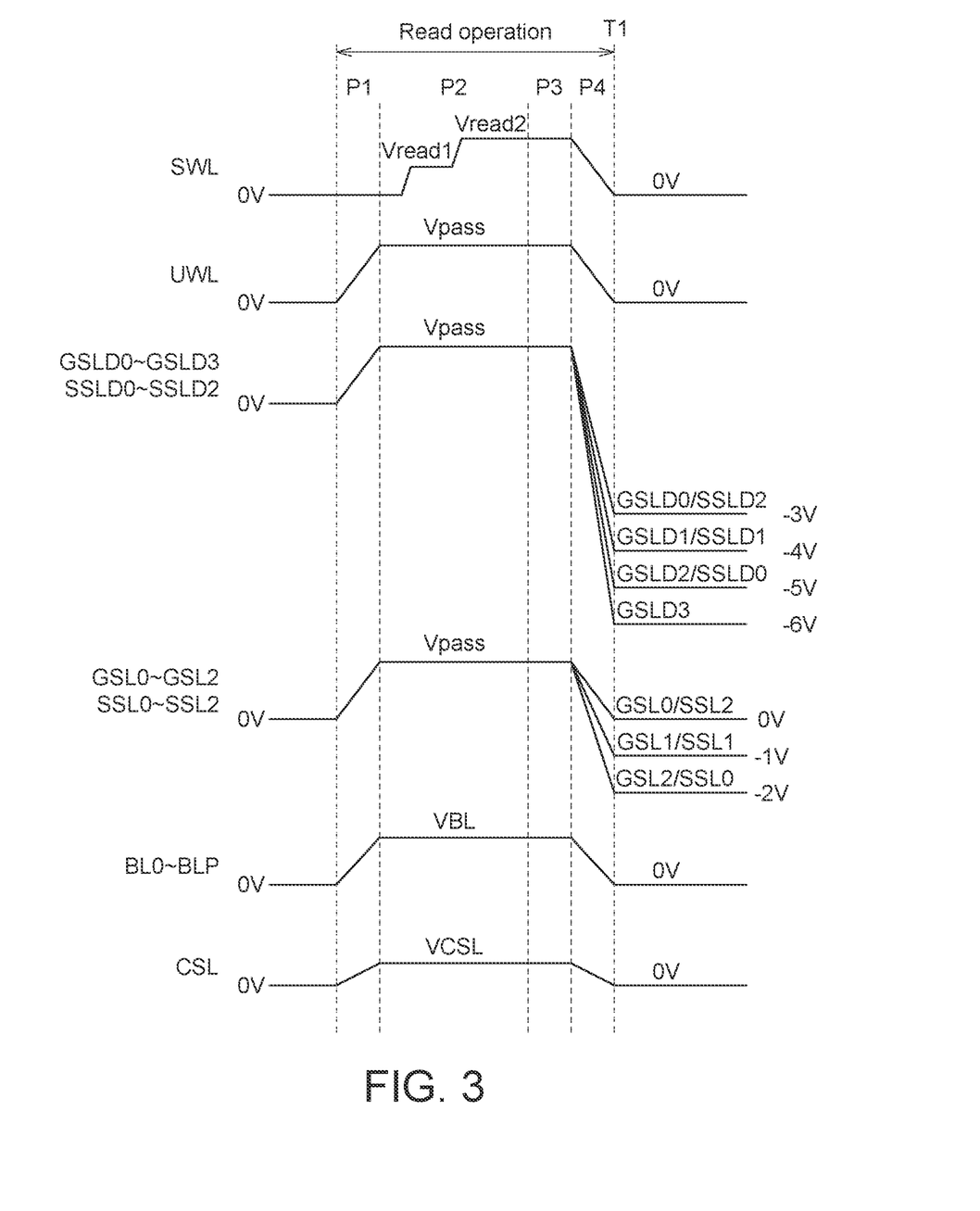
FIG. 3 shows a signal waveform of the memory device according to another embodiment of the application.

FIG. 3 shows a signal waveform of the memory device according to another embodiment of the application. FIG. 3 shows the read operation, but the application is not limited by this. Other embodiments of the application are applied in write verify which includes program verify and erase verify.

FIG. 3 is similar to FIG. 2. The difference between FIG. 2 and FIG. 3 is described as follows.

As shown in FIG. 3, during the fourth phase P4, the selected word line SWL is biased to pull down from the sixth reference voltage Vread2 to the first reference voltage; the unselected word lines UWL are biased to pull down from the second reference voltage Vpass to the first reference voltage; the dummy ground select line GSLD0 and the dummy string select line SSLD2 are biased to pull down from the second reference voltage Vpass to a tenth reference voltage (for example but not limited by −3V); the dummy ground select line GSLD1 and the dummy string select line SSLD1 are biased to pull down from the second reference voltage Vpass to an eleventh reference voltage (for example but not limited by −4V); the dummy ground select line GSLD2 and the dummy string select line SSLD0 are biased to pull down from the second reference voltage Vpass to a twelfth reference voltage (for example but not limited by −5V); the dummy ground select line GSLD3 is biased to pull down from the second reference voltage Vpass to a thirteenth reference voltage (for example but not limited by −6V); the around select line GSL0 and the string select line SSL2 are biased to pull down from the second reference voltage Vpass to the seventh reference voltage; the ground select line GSL1 and the string select line SSL1 are biased to pull down from the second reference voltage Vpass to the eighth reference voltage; the ground select line GSL2 and the string select line SSL0 are biased to pull down from the second reference voltage Vpass to the ninth reference voltage; the bit lines BL0-BLP are biased to pull down from the third reference voltage VBL to the first reference voltage; and the common source line CSL is biased to pull down from the fourth reference voltage VCSL to the first reference voltage.

As shown in FIG. 3, during the fourth phase P4 (i.e. during a word line voltage falling phase), the gradually falling reference voltages are applied to the ground select lines GSL0-GSL2, the string select lines SSL0-SSL2, the dummy ground select lines GSLD0-GSLD3 and the dummy string select lines SSLD0-SSLD2 to prevent the hot electron mode disturbance. The reasons are described as follows.

After the four phases P1-P4 of the read operations are completed, at the timing T1, the selected word line SWL is maintained at the first reference voltage; the unselected word lines UWL are maintained at the first reference voltage; the dummy ground select line GSLD0 and the dummy string select line SSLD2 are maintained at the tenth reference voltage; the dummy ground select line GSLD1 and the dummy string select line SSLD1 are maintained at the eleventh reference voltage; the dummy ground select line GSLD2 and the dummy string select line SSLD0 are maintained at the twelfth reference voltage; the dummy ground select line GSLD3 is maintained at the thirteenth reference voltage; the ground select line GSL0 and the string select line SSL2 are maintained at the seventh reference voltage; the ground select line GSL1 and the string select line SSL1 are maintained at the eighth reference voltage; the ground select line GSL2 and the string select line SSL0 are maintained at the ninth reference voltage; the bit lines BL0-BLP are maintained at the first reference voltage; and the common source line CSL is maintained at the first reference voltage.

In FIG. 3, the voltage difference between the tenth reference voltage, the eleventh reference voltage, the twelfth reference voltage and the thirteenth reference voltage is 1V, but the application is not limited by this. In other possible embodiment of the application, the voltage difference between tenth reference voltage, the eleventh reference voltage, the twelfth reference voltage and the thirteenth reference voltage may have other values, which is still within the spirit and the scope of the application.

In FIG. 3, the voltages applied to the dummy ground select lines GSLD0-GSLD3 and the dummy string select lines SSLD0-SSLD2 have linear falling waveforms, but the application is not limited by this. In other possible embodiment of the application, the voltages applied to the dummy ground select lines GSLD0-GSLD3 and the dummy string select lines SSLD0-SSLD2 may have other falling waveforms, which is still within the spirit and the scope of the application.

As shown in FIG. 3, in one embodiment of the application, when the read operation or the write-verify operation is completed, during the word line voltage lowering phase (the fourth phase P4), a plurality of different gradually lowering dummy signal line reference voltages are synchronously applied to the dummy ground select lines and the dummy string select lines. Values of the different gradually lowering dummy signal line reference voltages are corresponding to a plurality of dummy signal line positions of the dummy ground select lines and the dummy string select lines.

As shown in FIG. 3, in one embodiment of the application, a first dummy signal reference voltage applied to an outer dummy ground select line (for example GSLD0) and an outer dummy string select line (for example SSLD2) among the dummy ground select lines and the dummy string select lines is higher than a second dummy signal reference voltage applied to an inner dummy ground select line (for example GSLD1) and an inner dummy string select line (for example SSLD1) among the dummy ground select lines and the dummy string select lines.

Figure 4:
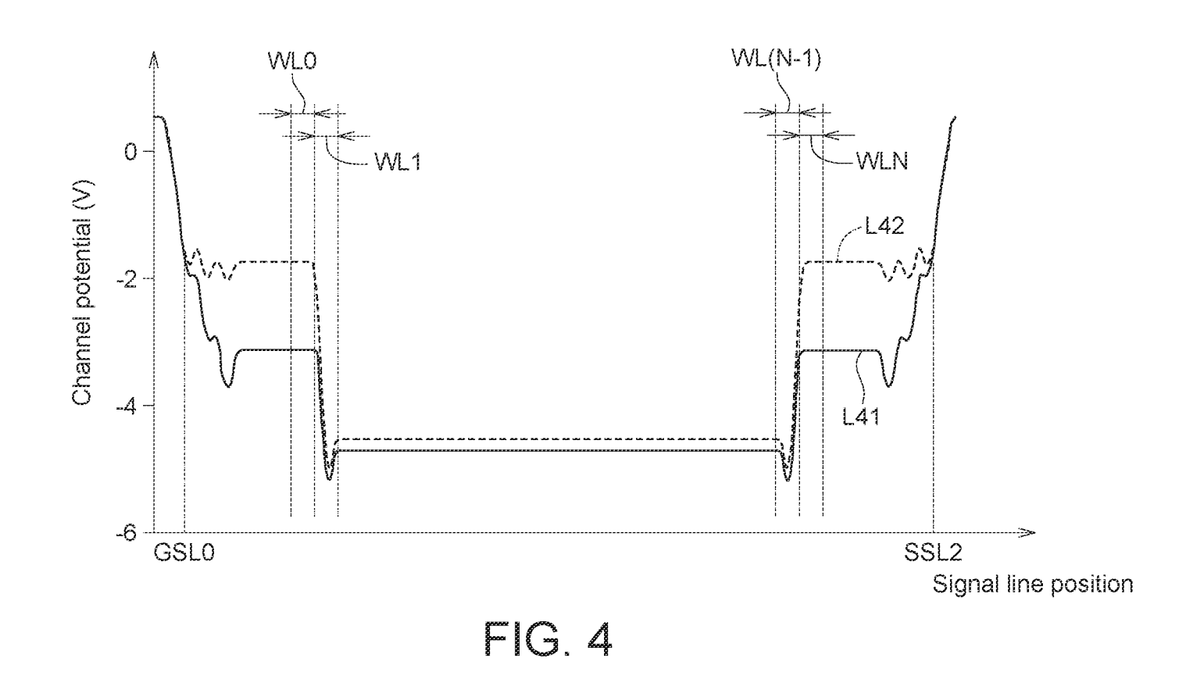
FIG. 4 shows channel potential waveforms according to the prior art and one embodiment of the application.

FIG. 4 shows channel potential waveforms according to the prior art and one embodiment of the application. In FIG. 4, the horizontal axis refers to a signal line position, the leftmost position refers to the ground select line GSL0 at the bottom while the rightmost position refers to the string select line SSL2 at the top. In FIG. 4, the vertical axis refers to the channel potential. The curve L41 indicates the channel potentials at the signal positions measured at the end of the operation (for example, the timing T1 in FIG. 2 or FIG. 3) in one embodiment of the application; and the curve L42 indicates the channel potentials at the signal positions measured at the end of the operation (for example, the timing T1 in FIG. 2 or FIG. 3) in the prior art. In FIG. 4, it is assumed that the word lines WL1 and WL(N-1) are at the programmed state while other word lines WL0, WL2-WL(N-2) and WLN are at the erased state.

By comparing the curves L41 and L42, in one embodiment of the application, by applying the gradually lowered reference voltages to the ground select lines, the string select lines, and/or the dummy ground select lines, the dummy string select lines, not only the voltage difference between the word lines WL1 and WL0, but also the voltage difference between the word lines WL(N-1) and WLN are reduced. Thus, the hot-electron mode disturbance at the word lines WL0 and WLN is eliminated; and the operations and the performance of the memory device are prevented from being negatively affected.

Further, in one embodiment of the application, by applying the gradually lowered reference voltages to the ground select lines, the string select lines, and/or the dummy ground select lines, the dummy string select lines, the ground select lines, the string select lines, and/or the dummy ground select lines, the dummy string select lines are prevented from additional disturbance.

Figure 5:
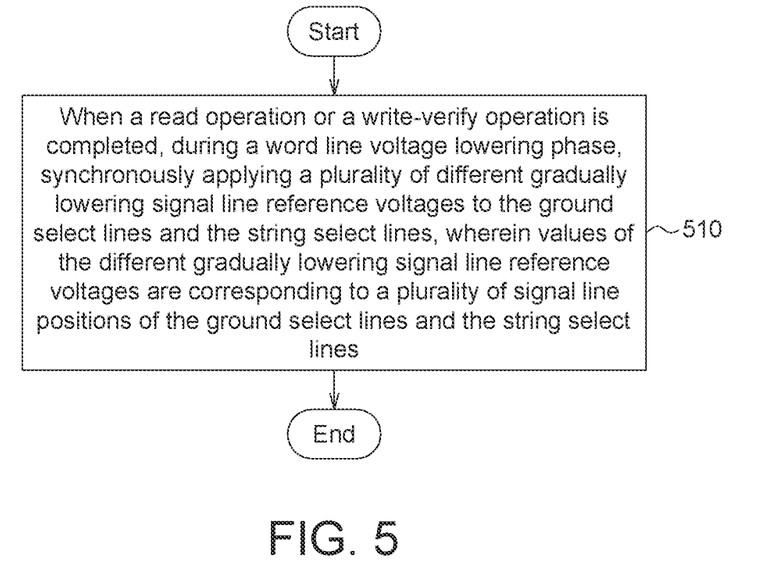
FIG. 5 shows an operation method for a memory device according to one embodiment of the application.

FIG. 5 shows an operation method for a memory device according to one embodiment of the application. As shown in FIG. 5, the operation method for the memory device includes: when a read operation or a write-verify operation is completed, during a word line voltage lowering phase, synchronously applying a plurality of different gradually lowering signal line reference voltages to the ground select lines and the string select lines, wherein values of the different gradually lowering signal line reference voltages are corresponding to a plurality of signal line positions of the ground select lines and the string select lines (510).

According to one embodiment of the application, when the read operation or the write-verify operation is completed, at the word line voltage lowering phase (for example the four phase P4), the outermost ground select line (the ground select line GSL0 in FIG. 1) and the outermost string select line (the string select line SSL2 in FIG. 1) is lowered to the first reference voltage (for example 0V); and the inner ground select line (the ground select lines GSL1-GL2 in FIG. 1) and the inner string select line (the string select lines SSL0-SSL1 in FIG. 1) are synchronously lowered to gradually negative voltages. By so, the hot electron mode disturbance is prevented.

Still further, according to one embodiment of the application, when the read operation or the write-verify operation is completed, at the word line voltage lowering phase (for example the four phase P4), the outermost ground select line (the ground select line GSL0 in FIG. 1) and the outermost string select line (the string select line SSL2 in FIG. 1) is lowered to the first reference voltage (for example 0V); the inner ground select line (the ground select lines GSL1-GL2 in FIG. 1) and the inner string select line (the string select lines SSL0-SSL1 in FIG. 1) are synchronously lowered to gradually negative voltages; and the more inner dummy ground select line (the dummy ground select lines GSLD0-GSLD3 in FIG. 1) and the more inner dummy string select line (the dummy string select lines SSLD0-SSLD2 in FIG. 1) are synchronously lowered to more gradually negative voltages. By so, the hot electron mode disturbance is prevented.

One embodiment of the application is applied to 3D memory device sensitive to hot electron mode disturbance, for example but not limited by, 3D floating-gate (FG) memory device, 3D nitride charge trapping memory device, 3D Gate-all-around vertical channel (GAA-VC) memory device and so on.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An operation method for a memory device including a plurality of ground select lines, a plurality of string select lines, a plurality of dummy ground select lines and a plurality of dummy string select lines, the operation method including:
   when a read operation or a write-verify operation is completed, during a word line voltage lowering phase, synchronously applying a plurality of different gradually lowering signal line reference voltages to the ground select lines and the string select lines,
   wherein values of the different gradually lowering signal line reference voltages are corresponding to a plurality of signal line positions of the ground select lines and the string select lines.

2. The operation method for the memory device according to claim 1, further including:
   when the read operation or the write-verify operation is completed, during the word line voltage lowering phase, synchronously applying a plurality of different gradually lowering dummy signal line reference voltages to the dummy ground select lines and the dummy string select lines; and
   values of the different gradually lowering dummy signal line reference voltages are corresponding to a plurality of dummy signal line positions of the dummy ground select lines and the dummy string select lines.

3. The operation method for the memory device according to claim 1, wherein a first signal reference voltage applied to an outer ground select line and an outer string select line among the ground select lines and the string select lines is higher than a second signal reference voltage applied to an inner ground select line and an inner string select line among the ground select lines and the string select lines.

4. The operation method for the memory device according to claim 2, wherein a first dummy signal reference voltage applied to an outer dummy ground select line and an outer dummy string select line among the dummy ground select lines and the dummy string select lines is higher than a second dummy signal reference voltage applied to an inner dummy ground select line and an inner dummy string select line among the dummy ground select lines and the dummy string select lines.

5. The operation method for the memory device according to claim 1, wherein the different gradually lowering signal line reference voltages are linear lowering.

6. The operation method for the memory device according to claim 2, wherein the different gradually lowering dummy signal line reference voltages are linear lowering.

7. The operation method for the memory device according to claim 1, wherein a plurality of voltage differences between the different gradually lowering signal line reference voltages are the same.

8. The operation method for the memory device according to claim 2, wherein a plurality of voltage differences between the different gradually lowering dummy signal line reference voltages are the same.

9. A memory device including;
a plurality of memory cells,
a plurality of ground select lines,
a plurality of dummy around select lines,
a plurality of bit lines,
a plurality of string select lines,
a plurality of dummy string select lines,
a plurality of word lines, coupled to the memory cells, the memory cells further coupled to the bit lines; and
a plurality of switch, coupled to the ground select lines, the dummy ground select lines, the bit lines, the string select lines and the dummy string select lines,
when a read operation or a write-verify operation is completed, during a word line voltage lowering phase, synchronously applying a plurality of different gradually lowering signal line reference voltages to the ground select lines and the string select lines,
wherein values of the different gradually lowering signal line reference voltages are corresponding to a plurality of signal line positions of the ground select lines and the string select lines.

10. The memory device according to claim 9, wherein when the read operation or the write-verify operation is completed, during the word line voltage lowering phase, a plurality of different gradually lowering dummy signal line reference voltages are synchronously applied to the dummy ground select lines and the dummy string select lines; and
values of the different gradually lowering dummy signal line reference voltages are corresponding to a plurality of dummy signal line positions of the dummy ground select lines and the dummy string select lines.

11. The memory device according to claim 9, wherein a first signal reference voltage applied to an outer ground select line and an outer string select line among the ground select lines and the string select lines is higher than a second signal reference voltage applied to an inner ground select line and an inner string select line among the ground select lines and the string select lines.

12. The memory device according to claim 10, wherein a first dummy signal reference voltage applied to an outer dummy ground select line and an outer dummy string select line among the dummy ground select lines and the dummy string select lines is higher than a second dummy signal reference voltage applied to an inner dummy ground select line and an inner dummy string select line among the dummy ground select lines and the dummy string select lines.

13. The memory device according to claim 9, wherein the different gradually lowering signal line reference voltages are linear lowering.

14. The memory device according to claim 10, wherein the different gradually lowering dummy signal line reference voltages are linear lowering.

15. The memory device according to claim herein a plurality of voltage differences between the different gradually lowering signal line reference voltages are the same.

16. The memory device according to claim 10, wherein a plurality of voltage differences between the different gradually lowering dummy signal line reference voltages are the same.

* * * * *